US009051647B2

(12) United States Patent
Cooperberg et al.

(10) Patent No.: US 9,051,647 B2
(45) Date of Patent: Jun. 9, 2015

(54) TUNABLE MULTI-ZONE GAS INJECTION SYSTEM

(75) Inventors: David J. Cooperberg, Mount Kisco, NY (US); Valid Vahedi, Albany, CA (US); Douglas Ratto, Santa Clara, CA (US); Harmeet Singh, Berkeley, CA (US); Neil Benjamin, East Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 1048 days.

(21) Appl. No.: 12/605,027

(22) Filed: Oct. 23, 2009

(65) Prior Publication Data

US 2010/0041238 A1      Feb. 18, 2010

Related U.S. Application Data

(62) Division of application No. 10/024,208, filed on Dec. 21, 2001, now abandoned.

(51) Int. Cl.
*H01L 21/306* (2006.01)
*C23C 16/00* (2006.01)
(Continued)

(52) U.S. Cl.
CPC ......... *C23C 16/45574* (2013.01); *C23C 16/507* (2013.01); *H01J 37/321* (2013.01); *H01J 37/3244* (2013.01); *H01J 2237/3323* (2013.01); *H01J 2237/3344* (2013.01)

(58) Field of Classification Search
USPC ...................................... 118/715; 156/345.33
See application file for complete search history.

(56) References Cited

U.S. PATENT DOCUMENTS

| 4,105,810 A | 8/1978 | Yamazaki et al. |
| 4,270,999 A | 6/1981 | Hassan et al. |

(Continued)

FOREIGN PATENT DOCUMENTS

| EP | 0892083 | 1/1999 |
| JP | 59150417 A | 8/1984 |

(Continued)

OTHER PUBLICATIONS

Japanese Official Action mailed Feb. 8, 2010 for Japanese Patent Appln. No. 2003-537097 (partial translation submitted).

(Continued)

*Primary Examiner* — Luz Alejandro Mulero
(74) *Attorney, Agent, or Firm* — Buchanan Ingersoll & Rooney PC

(57) ABSTRACT

A tunable multi-zone injection system for a plasma processing system for plasma processing of substrates such as semiconductor wafers. The system includes a plasma processing chamber, a substrate support for supporting a substrate within the processing chamber, a dielectric member having an interior surface facing the substrate support, the dielectric member forming a wall of the processing chamber, a gas injector fixed to part of or removably mounted in an opening in the dielectric window, the gas injector including a plurality of gas outlets supplying process gas at adjustable flow rates to multiple zones of the chamber, and an RF energy source such as a planar or non-planar spiral coil which inductively couples RF energy through the dielectric member and into the chamber to energize the process gas into a plasma state. The injector can include an on-axis outlet supplying process gas at a first flow rate to a central zone and off-axis outlets supplying the same process gas at a second flow rate to an annular zone surrounding the central zone. The arrangement permits modification of gas delivery to meet the needs of a particular processing regime by allowing independent adjustment of the gas flow to multiple zones in the chamber. In addition, compared to consumable showerhead arrangements, a removably mounted gas injector can be replaced more easily and economically.

12 Claims, 6 Drawing Sheets

(51) Int. Cl.
*C23C 16/455* (2006.01)
*C23C 16/507* (2006.01)
*H01J 37/32* (2006.01)

(56) References Cited

U.S. PATENT DOCUMENTS

| | | |
|---|---|---|
| 4,439,401 A | 3/1984 | Voll et al. |
| 4,612,077 A | 9/1986 | Tracy et al. |
| 4,614,639 A | 9/1986 | Hegedus |
| 4,691,662 A | 9/1987 | Roppel et al. |
| 4,943,345 A | 7/1990 | Asmussen et al. |
| 4,980,204 A | 12/1990 | Fujii et al. |
| 4,992,301 A | 2/1991 | Shishiguchi et al. |
| 4,996,077 A | 2/1991 | Moslehi et al. |
| 5,104,634 A | 4/1992 | Calcote |
| 5,134,965 A | 8/1992 | Tokuda et al. |
| 5,160,543 A | 11/1992 | Ishihara et al. |
| 5,164,040 A | 11/1992 | Eres et al. |
| 5,200,016 A | 4/1993 | Namose |
| 5,252,132 A | 10/1993 | Oda et al. |
| 5,252,133 A | 10/1993 | Miyazaki et al. |
| 5,425,810 A | 6/1995 | Conti et al. |
| 5,522,934 A | 6/1996 | Suzuki et al. |
| 5,522,936 A | 6/1996 | Tamura |
| 5,525,159 A | 6/1996 | Hama et al. |
| 5,529,657 A | 6/1996 | Ishii |
| 5,531,834 A | 7/1996 | Ishizuka et al. |
| 5,532,190 A | 7/1996 | Goodyear et al. |
| 5,540,800 A | 7/1996 | Qian |
| 5,580,385 A | 12/1996 | Paranjpe et al. |
| 5,589,002 A | 12/1996 | Su |
| 5,614,055 A | 3/1997 | Fairbairn et al. |
| 5,643,394 A | 7/1997 | Maydan et al. |
| 5,680,013 A | 10/1997 | Dornfest et al. |
| 5,685,942 A | 11/1997 | Ishii |
| 5,734,143 A | 3/1998 | Kawase et al. |
| 5,746,875 A | 5/1998 | Maydan et al. |
| 5,772,771 A | 6/1998 | Li et al. |
| 5,792,269 A | 8/1998 | Deacon et al. |
| 5,885,358 A | 3/1999 | Maydan et al. |
| 5,897,059 A | 4/1999 | Muller |
| 5,935,373 A | 8/1999 | Koshimizu |
| 5,958,140 A | 9/1999 | Arami et al. |
| 6,007,330 A | 12/1999 | Gauthier |
| 6,013,155 A | 1/2000 | McMillin et al. |
| 6,042,687 A | 3/2000 | Singh et al. |
| 6,052,176 A | 4/2000 | Ni et al. |
| 6,070,551 A | 6/2000 | Li et al. |
| 6,077,357 A | 6/2000 | Rossman et al. |
| 6,090,210 A | 7/2000 | Ballance et al. |
| 6,132,512 A | 10/2000 | Horie et al. |
| 6,143,078 A | 11/2000 | Ishikawa et al. |
| 6,170,428 B1 | 1/2001 | Redeker et al. |
| 6,230,651 B1 | 5/2001 | Ni et al. |
| 6,251,187 B1 | 6/2001 | Li et al. |
| 6,257,168 B1 | 7/2001 | Ni et al. |
| 6,263,829 B1 | 7/2001 | Schneider et al. |
| 6,287,643 B1 | 9/2001 | Powell et al. |
| 6,294,466 B1 | 9/2001 | Chang |
| 6,391,148 B2 | 5/2002 | Marks et al. |
| 6,403,491 B1 | 6/2002 | Liu et al. |
| 6,450,117 B1 | 9/2002 | Murugesh et al. |
| 7,785,417 B2 | 8/2010 | Ni et al. |

FOREIGN PATENT DOCUMENTS

| | | |
|---|---|---|
| JP | 61-100935 A | 5/1986 |
| JP | H08-158072 | 5/1996 |
| JP | 9115694 A | 5/1997 |
| WO | WO99/57747 | 11/1999 |
| WO | WO00/41212 | 7/2000 |
| WO | WO01/37317 A1 | 5/2001 |

OTHER PUBLICATIONS

Translation of Japanese Official Action mailed Feb. 12, 2010 for Japanese Patent Appln. No. 2000592857.
Translation of Chinese Official Action mailed Aug. 11, 2010 for Chinese Patent Appln. No. 200810170188.9.
Commonly Owned U.S. Appl. No. 12/805,865, filed Aug. 20, 2010.
Partial Translation of Japanese Final Official Action dated Aug. 30, 2010 for Japanese Patent Appln. No. 2003-537,097.
Written Opinion dated May 30, 2003 for PCT/US02/32057.
Asmussen, Jes, "Electron Cyclotron Resonance Microwave Discharges for Etching and Thin-Film Deposition", J. Vac. Sci. Technol. A, vol. 7, No. 3, May/Jun. 1989, pp. 883-893.
Chau, T.T. et al., "New Approach to Low Temperature Deposition of High-Quality Thin Films by Electron Cyclotron Resonance Microwave Plasmas", J. Va. Sci. Technol. B 10(5), Sep./Oct. 1992, pp. 2170-2178.
Herak, T.V. et al., "Low-Temperature Deposition of Silicon Dioxide Films from Electron Cyclotron Resonant Microwave Plasmas", J. Appl. Phys. 65(6), Mar. 15, 1989, pp. 2457-2463.
Japanese Official Action mailed Sep. 22, 2008 for Japanese Patent Appln. No. 2003-537097 (no translation available).
Korean Notice of Preliminary Rejection issued Aug. 7, 2009 for Korean Patent Appln. No. 2004-7005429 (translation submitted).

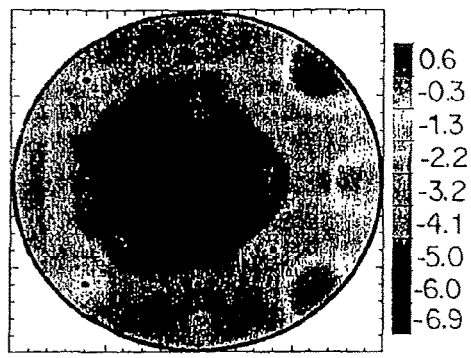 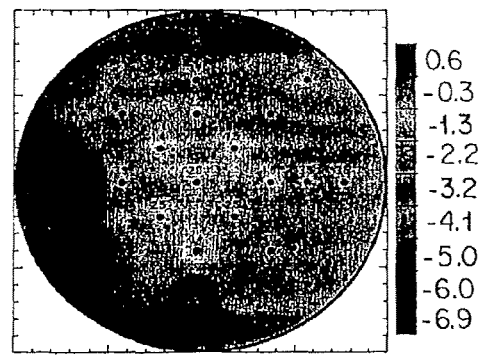
FIG. 6a        FIG. 6b
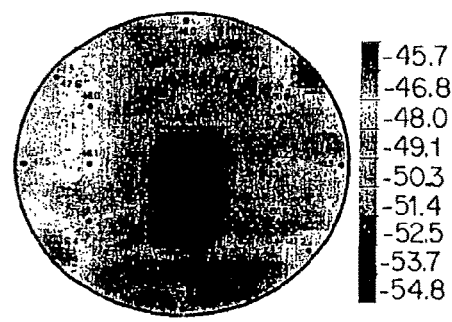 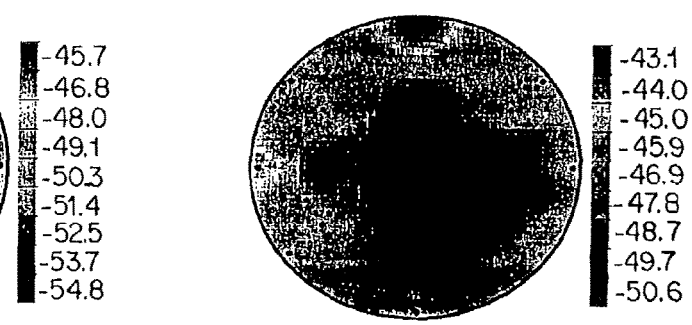
FIG. 7a        FIG. 7b
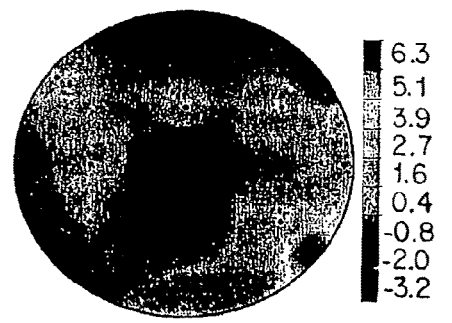 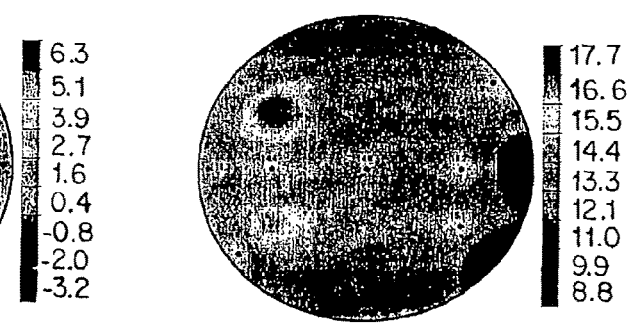
FIG. 8a        FIG. 8b

TUNABLE MULTI-ZONE GAS INJECTION SYSTEM

Cross-Reference to Related Applications

This application is a divisional application of U.S. application Ser. No. 10/024,208 entitled TUNABLE MULTI-ZONE GAS INJECTION SYSTEM, filed on Dec. 21, 2001 now abandoned, the entire content of which is hereby incorporated by reference.

FIELD OF THE INVENTION

The present invention relates to a system and a method for delivering reactants to a substrate in a plasma processing system for semiconductor substrates such as semiconductor wafers. More particularly, the present invention relates to a system and a method for injecting gas from a localized region over the center of the substrate to maximize processing uniformity and efficiency.

BACKGROUND OF THE INVENTION

Vacuum processing chambers are generally used for etching or chemical vapor depositing (CVD) of materials on substrates by supplying process gas to the vacuum chamber and applying a radio frequency (RF) field to the gas. The method of injection of process gasses into the chamber may have a dramatic effect on the distribution of chemically reactive species above the substrate surface and thus the overall process. Showerhead gas injection and diffusive transport systems are commonly used to ensure even distribution of the process gas over the substrate. In the case of inductively coupled plasma etch chambers, for example, the evolution of etched features is largely governed by the spatially dependent density of these reactive species over the substrate and the distribution of energetic ions incident on the substrate.

U.S. Pat. No. 4,691,662 to Roppel et al. discloses a dual plasma microwave apparatus for etching and deposition in which process gas is fed by conduits mounted on a side wall of a processing chamber, extending over a portion of the substrate. U.S. Pat. No. 5,522,934 to Suzuki et al. discloses a gas injector arrangement including a plurality of gas supply nozzles positioned in a plurality of levels in a direction substantially perpendicular to the substrate wherein inert (rather than process) gas is injected through the center of the chamber ceiling. The gas supply nozzles at upper levels extend further toward the center of the substrate than those at lower levels. The injection holes are located at the distal ends of the gas supply nozzles. These systems are effective in delivering the process gas to the region above the substrate. However, because the conduits extend over the substrate surface between the substrate and the primary ion generation region, as the ions diffuse from the generation region toward the substrate the conduits can cast shadows of ion nonuniformity onto the substrate surface. This can lead to an undesirable loss in etch and deposition uniformity.

Other approaches employ gas supply conduits which do not extend over the substrate surface. "Electron Cyclotron Resonance Microwave Discharges for Etching and Thin-film Deposition," J. Vacuum Science and Technology A, Vol. 7, pp. 883-893 (1989) by J. Asmussen shows conduits extending only up to the substrate edge. "Low-temperature Deposition of Silicon Dioxide Films from Electron Cyclotron Resonant Microwave Plasmas," J. Applied Physics, Vol. 65, pp. 2457-2463 (1989) by T. V. Herak et al. illustrates a plasma CVD tool including a plurality of gas injection conduits that feed separate process gases. One set of conduits is mounted in the lower chamber wall with gas delivery orifices located just outside the periphery of the substrate support and at the distal ends of the conduits. These conduit arrangements can cause process drift problems as a result of heating of the ends of the conduits.

"New Approach to Low Temperature Deposition of High-quality Thin Films by Electron Cyclotron Resonance Microwave Plasmas," J. Vac. Sci. Tech, B, Vol. 10, pp. 2170-2178 (1992) by T. T. Chau et al. illustrates a plasma CVD tool including a gas inlet conduit mounted in the lower chamber wall, located just above and outside the periphery of the substrate support. The conduit is bent so that the injection axis is substantially parallel to the substrate. An additional horizontal conduit is provided for a second process gas. The gas injection orifices are located at the distal ends of the conduits. Injectors with the orifices located at the distal ends of the injector tubes may be prone to clogging after processing a relatively small batch of substrates, e.g., less than 100. This injector orifice clogging is detrimental as it can lead to nonuniform distribution of reactants, nonuniform film deposition or etching of the substrate, shifts in the overall deposition or etch rate, as well as economic inefficiency vis-à-vis tool downtime due to required maintenance.

Various systems have been proposed to improve process uniformity by injecting process gas at sonic or supersonic velocity using, for example, a single nozzle aimed at the center of the substrate as disclosed in commonly-owned U.S. Pat. No. 6,230,651 to Ni et al. Other schemes utilize a showerhead arrangement with a distribution of small holes designed to produce supersonic injection. This second design can improve reactive neutral densities over the substrate but requires the presence of a conducting gas distribution and baffle system which may degrade inductive coupling and can be a source of process contamination.

U.S. Pat. No. 4,270,999 to Hassan et al. discloses the advantage of injecting process gases for plasma etch and deposition applications at sonic velocity. Hassan et al. notes that the attainment of sonic velocity in the nozzle promotes an explosive discharge from the vacuum terminus of the nozzle which engenders a highly swirled and uniform dissipation of gas molecules in the reaction zone surrounding the substrate. U.S. Pat. No. 5,614,055 to Fairbairn et al. discloses elongated supersonic spray nozzles that spray reactant gas at supersonic velocity toward the region overlying the substrate. The nozzles extend from the chamber wall toward the substrate, with each nozzle tip having a gas distribution orifice at the distal end. U.S. Pat. No. 4,943,345 to Asmussen et al. discloses a plasma CVD apparatus including supersonic nozzles for directing excited gas at the substrate. U.S. Pat. No. 5,164,040 to Eres et al. discloses pulsed supersonic jets for CVD. While these systems are intended to improve process uniformity, they suffer from the drawbacks noted above, namely clogging of the orifices at the distal ends of the injectors, which can adversely affect film uniformity on the substrate.

Several systems have been proposed to improve process uniformity by injecting process gas using multiple injection nozzles. Commonly owned U.S. Pat. No. 6,013,155 to McMillin et al. discloses an RF plasma processing system wherein gas is supplied through injector tubes via orifices located away from the high electrical field line concentrations found at the distal tip of the tubes. This arrangement minimizes clogging of the orifices because the orifices are located away from areas where build-up of process byproducts occurs.

U.S. Pat. No. 4,996,077 to Moslehi et al. discloses an electron cyclotron resonance (ECR) device including gas injectors arranged around the periphery of a substrate to provide uniform distribution of non-plasma gases. The non-plasma gases are injected to reduce particle contamination, and the injectors are oriented to direct the non-plasma gas onto the substrate surface to be processed.

U.S. Pat. No. 5,252,133 to Miyazaki et al. discloses a multi-wafer non-plasma CVD apparatus including a vertical gas supply tube having a plurality of gas injection holes along a longitudinal axis. The injection holes extend along the longitudinal side of a wafer boat supporting a plurality of substrates to introduce gas into the chamber. Similarly, U.S. Pat. No. 4,992,301 to Shishiguchi et al. discloses a plurality of vertical gas supply tubes with gas emission holes along the length of the tube.

U.S. Pat. No. 6,042,687 to Singh et al. describes a system with two independent gas supplies. The primary supply injects gas towards the substrate and the secondary supply injects gas at the periphery of the substrate. The gas supplies represent separate assemblies and are fed from separate gas supply lines that may carry different gas mixtures. Other systems comprising independent gas sources and independent gas flow control are disclosed in U.S. Pat. Nos. 5,885,358 and 5,772,771.

With the industry trend toward increasing substrate sizes, methods and apparatus for ensuring uniform etching and deposition are becoming increasingly important. This is particularly evident in flat panel display processing. Conventional showerhead gas injection systems can deliver gases to the center of the substrate, but in order to locate the orifices close to the substrate, the chamber height must be reduced which can lead to an undesirable loss in uniformity. Radial gas injection systems may not provide adequate process gas delivery to the center of large area substrates typically encountered, for example, in flat panel processing. This is particularly true in bottom-pumped chamber designs commonly found in plasma processing systems.

The above-mentioned Fairbairn et al. patent also discloses a showerhead injection system in which injector orifices are located on the ceiling of the reactor. This showerhead system further includes a plurality of embedded magnets to reduce orifice clogging. U.S. Pat. No. 5,134,965 to Tokuda et al. discloses a processing system in which process gas is injected through inlets on the ceiling of a processing chamber. The gas is supplied toward a high density plasma region.

In addition to the systems described above, U.S. Pat. No. 4,614,639 to Hegedus discloses a parallel plate reactor supplied with process gas by a central port having a flared end in its top wall and a plurality of ports about the periphery of the chamber. U.S. Pat. Nos. 5,525,159 (Hama et al.), 5,529,657 (Ishii), 5,580,385 (Paranjpe et al.), 5,540,800 (Qian) and 5,531,834 (Ishizuka et al.) disclose plasma chamber arrangements supplied process gas by a showerhead and powered by an antenna which generates an inductively coupled plasma in the chamber. Apparatus and systems for providing a uniform distribution of gas across a substrate are disclosed in U.S. Pat. Nos. 6,263,829; 6,251,187; 6,143,078; 5,734,143; and 5,425,810.

In spite of the developments to date, there still is a need for optimizing uniformity and deposition for radio frequency plasma processing of a substrate while preventing clogging of the gas supply orifices and build up of processing by-products and improving convective transport above the substrate.

SUMMARY OF THE INVENTION

The invention provides a plasma processing system which includes a plasma processing chamber, a vacuum pump connected to the processing chamber, a substrate support on which a substrate is processed within the processing chamber, a dielectric member having an interior surface facing the substrate support, wherein the dielectric member forms a wall of the processing chamber, a gas injector extending through the dielectric member such that a distal end of the gas injector is exposed within the processing chamber, the gas injector including a plurality of gas outlets supplying process gas that is independently varied between at least some of the outlets into the processing chamber, and an RF energy source which inductively couples RF energy through the dielectric member and into the chamber to energize the process gas into a plasma state to process the substrate. The system is preferably a high density plasma chemical vapor deposition system or a high density plasma etching system.

The RF energy source can comprise an RF antenna and the gas injector can inject the process gas toward a primary plasma generation zone in the chamber. The gas outlets can be located in an axial end surface of the gas injector thus forming several gas outlet zones. For instance, the gas outlets can include a center gas outlet (on-axis zone) extending in an axial direction perpendicular to the exposed surface of the substrate and a plurality of angled gas outlets (off axis zones) extending at an acute angle to the axial direction. The injector outlets are positioned to improved uniformity of reactive species over the substrate. A single gas supply is split to feed each of the injection zones.

Gas injection can be partitioned between one or more than of the injector outlets using variable flow restriction devices in each of the separate gas lines that supply the different injection zones. By independently varying the setting of the flow restriction devices, the ratio of flows through multiple zones can be varied in order to create jets of varying size and at various angles with respect to the axis of the process chamber. This balance between on and off-axis injection determines the convective flow field downstream from the nozzle tip. This flow field can be used to modify the total flow in the chamber, which includes convective and diffuse components. As a result, the spatial density dependence of reactive species can be modulated with a goal of improving process uniformity.

The gas injector can inject the process gas at a subsonic, sonic, or supersonic velocity. In one embodiment, the gas injector includes a planar axial end face which is flush with the interior surface of the dielectric window. In another embodiment, the gas injector is removably mounted in the dielectric window and/or supplies the process gas into a central region of the chamber. The gas outlets can have various configurations and/or spatial arrangements. For example, the gas injector can include a closed distal end and the gas outlets can be oriented to inject process gas at an acute angle relative to a plane parallel to an exposed surface of the substrate. In the case where the gas injector is removably mounted in the opening in the dielectric window, at least one O-ring provides a vacuum seal between the gas injector and the dielectric window.

The invention also provides a method of plasma processing a substrate comprising placing a substrate on a substrate support in a processing chamber, wherein an interior surface of a dielectric member forming a wall of the processing chamber faces the substrate support, supplying process gas into the processing chamber from a gas injector extending through the dielectric member such that a distal end of the gas injector is exposed within the processing chamber, the gas injector including a plurality of gas outlets supplying process gas into the processing chamber, and energizing the process gas into a plasma state by inductively coupling RF energy produced by an RF energy source through the dielectric member into the processing chamber, the process gas being plasma phase reacted with an exposed surface of the substrate. According to a preferred embodiment of the invention, the outlet holes in the injector are fed by multiple gas supply lines, which are fed by a single gas source. The fraction of total flow through each of the supply lines may be varied with a control valve arrangement, e.g., a network of valves and throttling elements located outside the plasma chamber; thus, the flow pattern in the chamber is modulated by varying the ratio of conductances for each injection zone within the injector.

BRIEF DESCRIPTION OF THE DRAWINGS

FIG. 2 c shows a two-zone injector provided with an electrically conducting outer jacket.

FIGS. 6 a-b and 7a-b illustrate an improvement in critical dimension uniformity for polysilicon gate and trimmed photoresist mask by adjusting the flow ratio.

FIGS. 8 a-b show that mean etch characteristics can be tuned by adjusting process gas flow ratios.

DETAILED DESCRIPTION OF THE PREFERRED EMBODIMENTS

Figure 1:
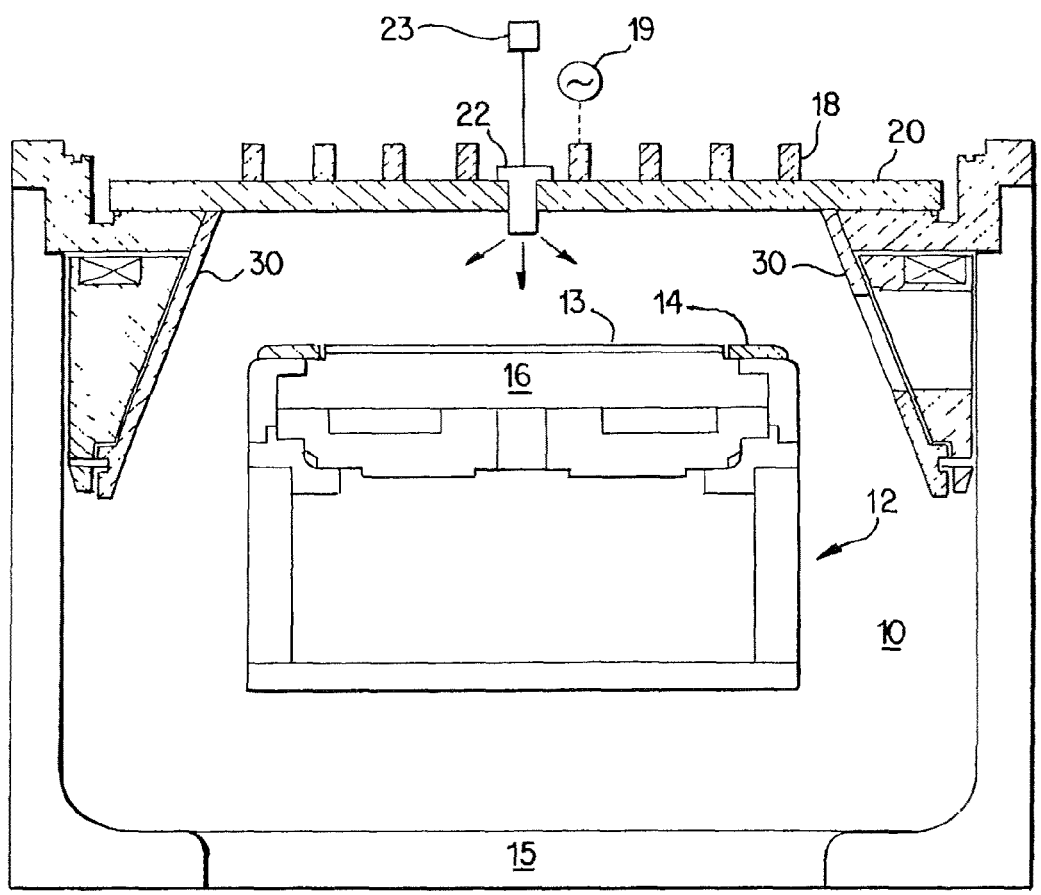
FIG. 1 illustrates a plasma processing system according to the present invention.

The present invention provides an improved gas injection system for plasma processing of substrates such as by etching or CVD. The injection system can be used to inject gases such as gases containing silicon, halogen (e.g., F, Cl, Br, etc.), oxygen, hydrogen, nitrogen, etc. The injection system can be used alone or in addition to other reactant/inert gas supply arrangements.

According to a preferred embodiment of the invention, a gas injection arrangement is provided for an inductively coupled plasma chamber. In the preferred arrangement, a gas injector is centrally located in an upper wall of the chamber and one or more gas outlets direct process gas into the chamber above a semiconductor substrate such as a wafer or flat panel display to be processed. The gas injector in accordance with the invention can improve center-to-edge uniformity and mean etch or deposition characteristics, e.g., critical dimension (CD), CD bias, profile and/or profile microloading.

The method of process gas injection into inductively coupled plasma etch chambers impacts the distribution of chemically reactive species above the substrate surface. The evolution of etched features is largely governed by the spatially dependent density of these reactive species over the substrate and the distribution of energetic ions incident on the substrate. The invention relates to a method for injecting gas from a localized region over the center of the substrate being processed which improves process performance.

Process performance can be measured by uniformity of etch rate, feature width and profile, fidelity of pattern transfer, and uniformity of pattern transfer. Improved performance can be achieved by partitioning process gas injection between injector outlets designed to create jets of varying size and at varying angles with respect to the axis of the process chamber, e.g., the injector outlets are preferably positioned to improve uniformity of reactive species over the substrate. Optimal gas injection and hence optimal process performance can be achieved by adjusting the ratio of flow through the injector outlets. In a preferred implementation the ratio of flow through on-axis and off-axis outlets may be varied. This balance between on-axis and off-axis injection determines the convective flow field downstream from the nozzle tip. This flow field can be used to modify the total flow in the chamber which includes convective and diffuse components. As a result, the spatial density dependence of reactive species can be modulated. The injection scheme is thus tunable, and furthermore minimizes significant contamination of the injector and gas injection lines via diffusion of plasma species generated in the interior of the chamber by maintaining at least a minimum flow of process gas through the outlets. For example, it may be desirable to maintain choked flow through the outlets. The injection scheme also provides the ability to tune gas injection for optimized performance with a single set of hardware. For example, for different etch applications (and different recipe steps within an etch application) that demand different ratios of on-axis to off-axis flow for optimum uniformity, the gas injection scheme allows for variation of this ratio without tool modification.

The gas outlets can be provided in a surface of the gas injector which is below, flush or above the surface of the upper chamber wall. For example, the gas injector can comprise a cylindrical member having gas outlets in a sidewall and a single gas outlet in an axial end thereof, the gas outlets being located between the upper wall and the exposed surface of the semiconductor substrate. In accordance with the invention, improved etch results can be achieved with a single gas injector located centrally in the upper chamber wall. However, more than one gas injector can be provided in the upper wall of the chamber, especially in the case where the plasma is generated by an antenna separated from the interior of the chamber by a dielectric layer or window and/or the chamber is used to process large substrates or a plurality of substrates.

The number of gas outlets and/or the angle of injection of gas flowing out of the gas outlets can be selected to provide desired gas distribution in a particular substrate processing regime. For instance, in the case of single wafer processing, the number, size, angle of injection and/or location of the outlets within the chamber can be adapted to a particular antenna design used to inductively couple RF, energy into the chamber, the gap between the upper wall and the exposed surface of the substrate, and etch process to be performed on the substrate.

FIG. 1 shows a plasma etch reactor 10 such as the TCP 9100™ made by Lam Research Corporation, the assignee of the present application. According to the invention, the gas injector is mounted in an opening extending through the dielectric window. The vacuum processing chamber 10 includes a substrate holder 12 providing an electrostatic clamping force via electrostatic chuck 16 to a substrate 13 as well as an RF bias to a substrate supported thereon and a focus ring 14 for confining plasma in an area above the substrate while it is He back-cooled. A source of energy for maintaining a high density (e.g. $10^{11}$-$10^{12}$ ions/cm$^3$) plasma in the chamber such as an antenna 18 powered by a suitable RF source and associated RF impedance matching circuitry 19 inductively couples RF energy into the chamber 10 so as to provide a high density plasma. The chamber includes suitable vacuum pumping apparatus (not shown) connected to outlet 15 for maintaining the interior of the chamber at a desired pressure (e.g. below 50 mTorr, typically 1-20 mTorr). A substantially planar dielectric window 20 of uniform thickness is provided between the antenna 18 and the interior of the processing chamber 10 and forms the vacuum wall at the top of the processing chamber 10. A gas injector 22 is provided in an opening in the window 20 and includes a plurality of gas outlets such as circular holes (not shown) for delivering process gas supplied by the gas supply 23 to the processing chamber 10. An optional conical or cylindrical liner 30 extends from the window 20 and surrounds the substrate holder 12.

In operation, a semiconductor substrate such as a wafer is positioned on the substrate holder 12 and is typically held in place by an electrostatic clamp, a mechanical clamp, or other clamping mechanism when He back-cooling is employed. Process gas is then supplied to the vacuum processing chamber 10 by passing the process gas through the gas injector 22. The window 20 can be planar and of uniform thickness as shown in FIG. 1 or have other configurations such as non-planar and/or non-uniform thickness geometries. A high density plasma is ignited in the space between the substrate and the window by supplying suitable RF power to the antenna 18. After completion of etching of an individual substrate, the processed substrate is removed from the chamber and another substrate is transferred into the chamber for processing thereof.

The gas injector 22 can comprise a separate member of the same or different material as the window. For instance, the gas injector can be made of metal such as aluminum or stainless steel or dielectric materials such as quartz, alumina, silicon nitride, silicon carbide, etc. According to a preferred embodiment, the gas injector is removably mounted in an opening in the window. However, the gas injector can also be integral with the window. For example, the gas injector can be brazed, sintered or otherwise bonded into an opening in the window or the gas injector can be machined or otherwise formed in the window, e.g. the window can be formed by sintering a ceramic powder such as $Al_2O_3$ or $Si_3N_4$ with the gas injector designed into the shape of the window.

FIGS. 2 a-b show an embodiment of the invention wherein the injector 22 provides multi-zone gas injection. In the embodiment shown, the injector 22 includes on-axis injection outlet 24 to supply process gas to a first zone to which process gas is supplied in an axial direction perpendicular to the substrate surface and an off-axis injection outlet 26 to supply process gas to a second zone to which process gas is supplied in an angled direction which is not perpendicular to the substrate. Both zones can be supplied with the same process gas (e.g., process gas from a gas manifold in which one or more process gases are combined). For example, main gas supply 32 can be split with a T-connector 34 to feed both injection zones. To control the gas flow in each line, flow controllers such as variable flow-restriction devices 36a and 36b can be placed in each of the separate gas lines that supply the different injection zones. The devices 36a and 36b can be set manually or operated automatically by suitable electronic controls. By independently varying the settings of the flow-restriction devices 36a and 36b the ratio of flows through the two outlets 24 and 26 can be varied. Alternative implementations include multiple outlets and variable flow-restriction valves and/or networks of fixed restrictors and valves, which would enable the total conductance to each injection zone to be adjusted to one or more preset dynamically controlled values.

Figure 2A:
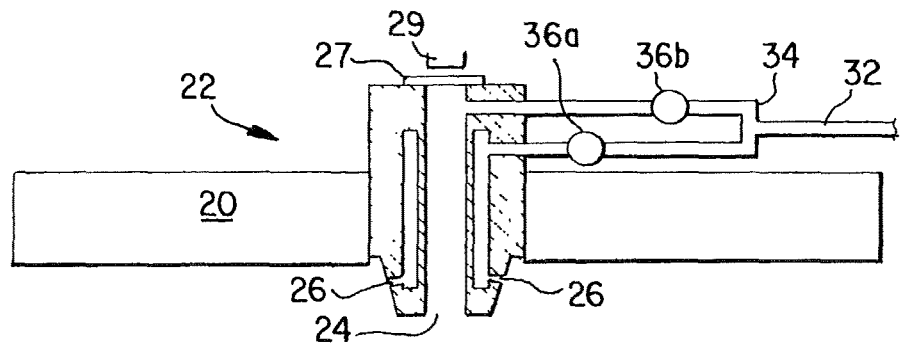
FIGS. 2 a-b show details of a two-zone injector supplied process gas by a single main gas supply which is split to independently feed gas to both injection zones.
Figure 2B:
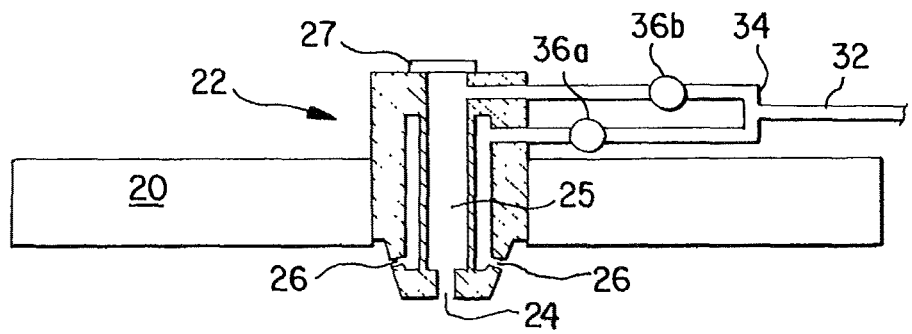

In the FIG. 2a embodiment, the center gas injection outlet is shown as a continuation of central bore 25 which allows the bore/outlet 24,25 to be used for interferometry measurements. For example, the upper end of the bore 25 can be sealed by a window 27 arranged to communicate with monitoring equipment 29 such as a lamp, spectrometer, optical fiber and lens arrangement as disclosed in U.S. Pat. No. 6,052,176, the disclosure of which is hereby incorporated by reference. In such an arrangement, the on-axis outlet has a larger diameter than the off-axis outlets, e.g., 1 cm on-axis outlet diameter and 1 mm diameter off-axis outlets. In the FIG. 2b embodiment, the on-axis outlet has a smaller diameter than the bore 25. The relative sizes of the on-axis and off-axis outlets can be selected to achieve a desired gas flow distribution. For example, the total cross-sectional area of the off-axis outlets can be less than, equal to, or greater than the total cross-sectional area of the on-axis outlet.

Figure 2C:
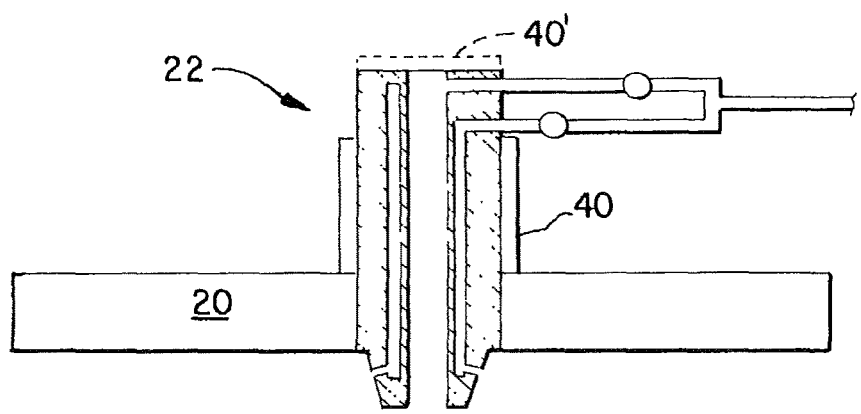

According to an embodiment of the invention, the injector can be provided with an electrically conducting shield that minimizes plasma ignition within the gas passages of the injector. If the injector is made of a non-conducting material such as quartz, a plasma discharge within the injector can be sustained by electric fields generated by the antenna. Reactive species generated within the injector may cause undesirable deposition on or etching of the injector interior. Thus, referring to FIG. 2c, in order to minimize the formation of sustained discharges, injector 22 can be provided with a conducting shield 40 or coated with an electrically conducting film. The conducting shield can be located on the outer surface of the injector, e.g. along the sidewall of the injector. The shield can significantly reduce electric fields inside the injector so as to prevent plasma ignition and/or maintenance of a plasma within gas passages of the injector. As shown in FIG. 2c, the conducting shield 40 can be designed as a tubular element such as an annular ring or an open ended cylindrical jacket. The shield can optionally comprise an electrically conductive coating on the side and/or top (e.g. 40') of the injector. The conducting jacket may be electrically grounded or floating in order to further reduce electric field strength inside the injector depending on the proximity of other grounded and RF driven conducting surfaces.

Figure 3A:
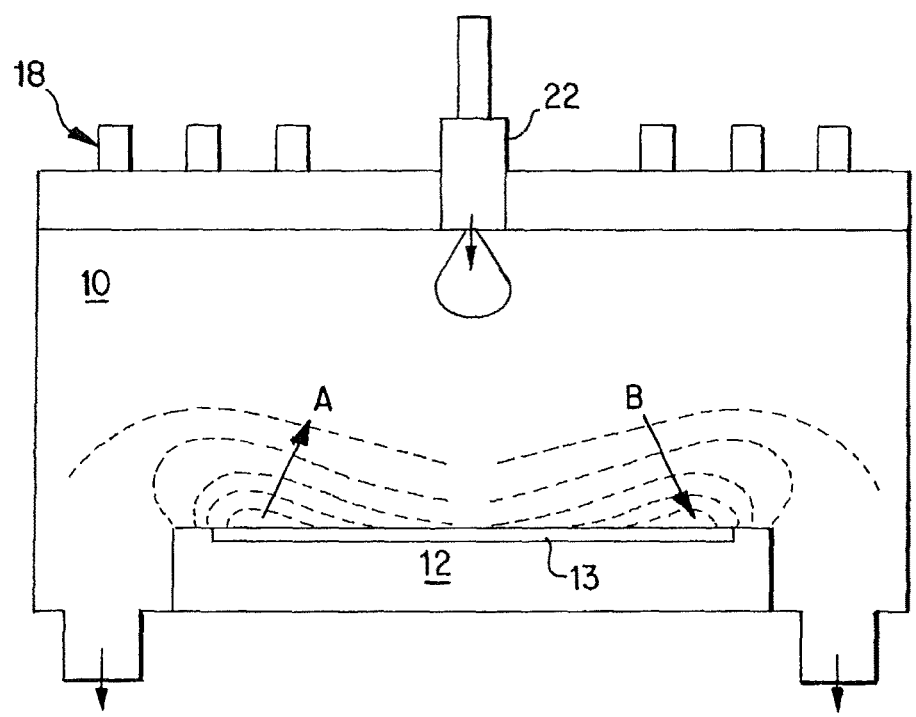
FIGS. 3 a-c show gas distribution effects in an inductively coupled plasma reactor using a gas injection arrangement in accordance with the present invention.
Figure 3B:
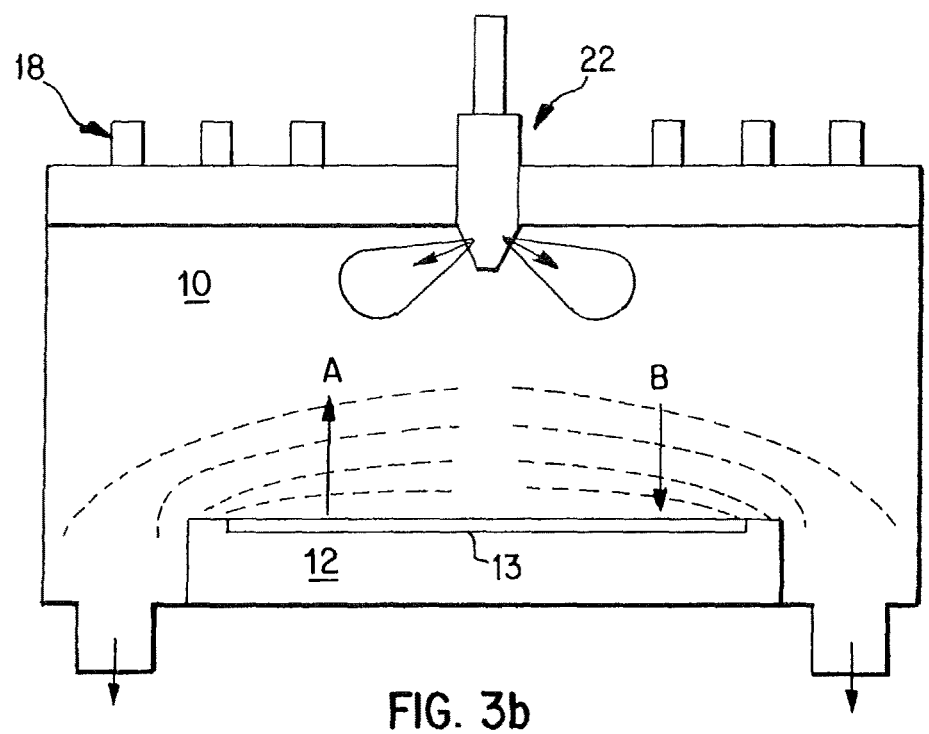
Figure 3C:
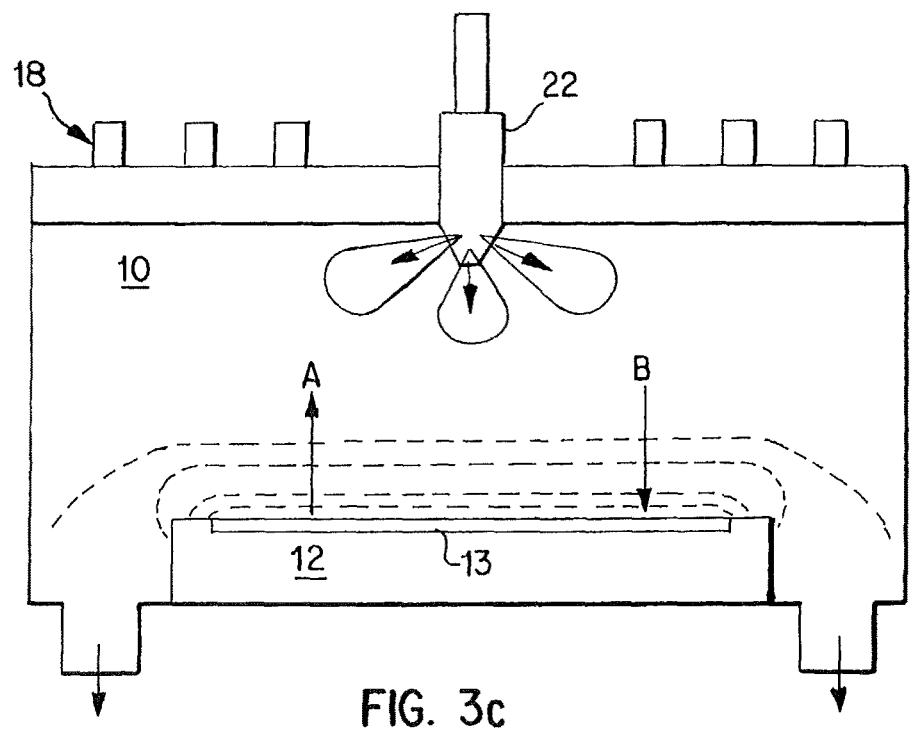

FIGS. 3a-c illustrate the impact of injector flow ratio on reactive species densities in an inductively coupled plasma reactor which includes a gas injector 22 mounted in an opening in the window 20 (increasing reactant density contours are shown by arrows A and increasing product density contours are shown by arrows B). In FIG. 3a, the flow restriction devices (not shown) are set to direct the gas supply mostly through the on-axis outlet. In FIG. 3b, the flow restriction devices (not shown) are set to direct the gas supply mostly through the off-axis outlets. In FIG. 3c, the ratio of the supply gas flow through the on-axis outlet and the off-axis outlets is tuned to produce flat density contours for both the reactant and product reactive species. These diagrams do not account for interaction between the injection flow distribution and plasma generation/density profile. The impact of reactant utilization is also not shown. It is reasonable to assume that such interactions do exist and can also impact plasma and reactive neutral density profiles over the substrate. The ratio of flows through the injector outlets can be chosen to optimize uniformity of one or more of the plasma and reactive species.

According to a preferred embodiment, the gas injector includes a single on-axis outlet and a plurality of off-axis outlets (e.g., 3 outlets arranged at 120° apart, 4 outlets arranged at 90° apart, etc.) The outlet arrangement is useful for a polysilicon etching process or an aluminum etching process. For instance, the off-axis outlets can be spaced 45° apart and located on a tapered side surface extending from the outer periphery of the axial end. The off-axis angles can form an acute, right, or obtuse angle with the axial direction. A preferred angle of the off-axis outlets is 10 to 90° with respect to the axial direction, more preferably 10 to 60°.

The most preferred mounting arrangement for the gas injector is a removable mounting arrangement. For instance, the gas injector could be screwed into the window or clamped to the window by a suitable clamping arrangement. A preferred removable mounting arrangement is one in which the gas injector is simply slidably fitted in the window with only one or more O-rings between the window and gas injector. For example, an O-ring can be provided in a groove around a lower part of the gas injector to provide a seal between the gas injector and the opening in the window. If desired, another O-ring can be provided in a groove in an upper part (not shown) of the gas injector to provide a seal between the gas injector and an exterior surface of the window.

The gas injector advantageously allows an operator to modify a process gas supply arrangement for a plasma etch reactor to optimize gas distribution in the reactor. For example, in plasma etching aluminum it is desirable to distribute the process gas into the plasma rather than direct the process gas directly towards the substrate being etched. In plasma etching polysilicon it is desirable to distribute the process gas into the plasma and direct the process gas directly towards the substrate being etched. Further optimization may involve selecting a gas injector which extends a desired distance below the inner surface of the window and/or includes a particular gas outlet arrangement. That is, depending on the etching process, the number of gas outlets, the location of the gas outlets such as on the axial end and/or along the sides of the gas injector as well as the angle(s) of injection of the gas outlets can be selected to provide optimum etching results. For example, the angle of injection is preferably larger for larger size substrates.

The gas injector can be used to plasma etch aluminum by injecting the process gas into the interior of the chamber such that the gas is provided in a desired distribution scheme. As an example, the process gas can include 100 to 500 sccm of a mixture of $Cl_2$ and $BCl_3$ or $Cl_2$ and $N_2$ or $BCl_3$, $Cl_2$ and $N_2$.

The gas injector can also be used to plasma etch polysilicon by injecting the process gas into the interior of the chamber such that the gas is provided in a desired distribution scheme. As an example, the process gas can include 100 to 500 sccm of a mixture of $Cl_2$ and HBr or $Cl_2$ only, or HBr only, with or without a carrier such as He and/or an additive such as $O_2$.

In processing a semiconductor substrate, the substrate is inserted into the processing chamber 10 and clamped by a mechanical or electrostatic clamp to a substrate support. The substrate is processed in the processing chamber by energizing a process gas in the processing chamber into a high density plasma. A source of energy maintains a high density (e.g., $10^9$-$10^{12}$ ions/cm$^3$, preferably $10^{10}$-$10^{12}$ ions/cm$^3$) plasma in the chamber. For example, an antenna 18, such as the planar multiturn spiral coil, a non-planar multiturn coil, or an antenna having another shape, powered by a suitable RF source and suitable RF impedance matching circuitry inductively couples RF energy into the chamber to generate a high density plasma. However, the plasma can be generated by other sources such as ECR, parallel plate, helicon, helical resonator, etc., type sources. The chamber may include a suitable vacuum pumping apparatus for maintaining the interior of the chamber at a desired pressure (e.g., below 5 Torr, preferably 1-100 mTorr). A dielectric window, such as the planar dielectric window 20 of uniform thickness or a non-planar dielectric window is provided between the antenna 18 and the interior of the processing chamber 10 and forms the wall at the top of the processing chamber 10.

A gas supply supplying process gas into the chamber includes the gas injector described above. The process gases include reactive gasses and optional carrier gases such as Ar. Due to small orifice size and number of gas outlets, a large pressure differential can develop between the gas injector and the chamber interior. For example, with the gas injector at a pressure of >1 Torr, and the chamber interior at a pressure of about 10 mTorr, the pressure differential is about 100:1. This results in choked, sonic flow at the gas outlets. If desired, the interior orifice of the gas outlets can be contoured to provide supersonic flow at each outlet.

Injecting the process gas at sonic velocity inhibits the plasma from penetrating the gas outlets. In the case of deposition of materials such as doped or undoped silicon dioxide, such a design prevents plasma decomposed gases such as $SiH_4$ from entering the injector from the interior of the chamber. This avoids subsequent formation of amorphous silicon residues within the gas outlets. The plasma processing system according to this embodiment can provide an increased deposition rate and improved uniformity on the substrate, compared to conventional gas distribution systems, by concentrating the silicon-containing process gas above the substrate and by preferentially directing the process gas onto specific regions of the substrate.

According to the invention, etch uniformity of metal such as aluminum, conductive semiconductor materials such as polysilicon and dielectric materials such as silicon dioxide including photoresist and selectivity to underlying materials using halogen and halocarbon based chemistries can be improved. In contrast, conventional injection through a showerhead incorporated in or below a dielectric window can result in nonuniform etching across the substrate, e.g., "center fast resist etching", which can lead to poor control of the etched features and profiles, and differences in features at the substrate center and edge. In addition, polymer formation on the showerhead can lead to undesirable particle flaking and contamination on the substrate. Other problems associated with showerhead arrangements include the additional costs associated with providing a sandwich type structure for delivering gas across the window, temperature control, the effects of gas/plasma erosion of the showerhead, ignition of plasma in the showerhead gas outlets or gap between the showerhead and the overlying window, lack of process repeatability, process drift, etc. In contrast, edge injection via a gas injection ring can result in "edge fast etching" and polymer deposition on the chamber walls. Photoresist to oxide selectivities are typically only 1-4 in these cases, where 5-10 would be desirable. The gas injector according to the invention can provide improvement in the uniformity of the resist etch rate (typically 6% 3σ) with simultaneous resist to oxide selectivities of at least 5, preferably 10 or more. The present preferred injection design thus can provide a much more uniform flux of reactive intermediates and chemical radicals to the substrate surface, including both etch species, such as atomic chlorine and fluorine, and polymerizing species, such as $C_xF_yH_z$ gases, e.g., CF, $CF_2$, $CF_3$, etc.

As the substrate size increases, so does the need for center fed gas. Injection systems supplying gas from gas ring arrangements cannot provide adequate process gas delivery to the center of large area substrates typically encountered in flat panel processing. This is particularly true in bottom-pumped chamber designs commonly found in plasma processing systems. In the case of plasma etching, without center gas feeding in accordance with the invention, etch by-products may stagnate above the center of the substrate in which case transport is essentially through diffusion alone. This can lead to undesirable nonuniform etching across the substrate.

According to the invention, process gas is injected within the plasma region facing and in close proximity to, the center of the substrate. For instance, gas outlets of the gas injector can be located far enough below the inner surface of the window such that the gas outlets are immersed within the plasma. The gas outlets are preferably located such that there is adequate diffusion of the ions and neutral species in order to ensure a uniform etch or deposition rate. Accordingly, the gas injector can be located in a region where the azimuthal electric field induced by the TCP™ coil falls to zero, which minimizes perturbations of the plasma generation zone. Furthermore, it is preferable that the gas injector is immersed a suitable distance such as no more than about 80% of the distance between the chamber ceiling and the substrate. This ensures that the ion diffusion from upper regions of the chamber have sufficient space to fill in the lower ion density immediately beneath the gas injector. This will minimize any "shadow" of the gas injector in the ion flux to the substrate.

Using the immersed gas injector allows for independent selection of the center gas feed location and the chamber aspect ratio. This facilitates efficient utilization of process gas and improves process gas delivery to the central region of large area substrates with minimal disturbance to plasma uniformity. This configuration is also advantageous because locating the gas outlets close to the substrate increases the convective transport relative to diffusive transport in the region immediately above the substrate. In addition to improving the delivery of the reactants, the gas injector facilitates efficient transport of etch by-products out of the substrate region, which can favorably impact etch uniformity and profile control, particularly in chemically driven applications such as aluminum etching.

The gas outlets can have any desired shape such as uniform diameter along the entire length thereof or other shape such as conically tapered, flared surfaces or radially contoured surfaces. The gas outlets can be oriented to inject the gas in any direction, including directly at the substrate, at an acute angle with respect to the substrate, parallel to the substrate or back toward the upper plasma boundary surface (at an oblique angle with respect to the longitudinal axis of the nozzle), or combinations thereof. It is desired to achieve a uniform flux of chemical radicals and reactive intermediate species onto the substrate surface to facilitate uniform etch and deposition rates across the large area substrate. If desired, additional gas injection arrangements can also be provided near the periphery of the substrate or from other chamber walls.

Preferably, no sharp corners exist at the distal end of the gas injector in order to reduce local electric field enhancement near the tip. However, there may be cases where such field enhancement can be advantageous.

EXAMPLE 1

Figure 4C:
FIGS. 4 a-c show the effect of flow ratio on blanket polysilicon etch rate using a gate etch process.
Figure 4B:
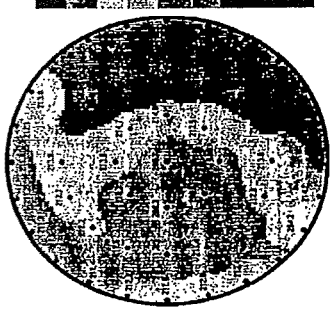
Figure 4A:
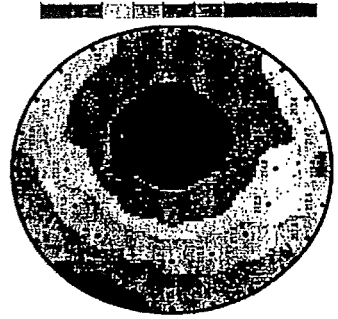

Polysilicon etch depth statistics (mean, standard deviation, and range) were measured as a function of on-axis:off-axis gas flow ratio. FIGS. 4a-c show etch profiles for a gate etch process wherein FIG. 4a shows the effect of higher on-axis gas injection and FIG. 4c shows the effect of higher off-axis injection. Predominately on-axis flow conditions produced an etch depth of 212.9±4.7 nm (±2.2%) and a range of 18.3 nm (±1.4%) (see polysilicon etch results in FIG. 4a). Predominately off-axis flow conditions produced an etch depth of 212.6±5.3 nm (±2.5%) and a range of 22.3 nm (±1.7%) (see polysilicon etch results in FIG. 4c). A mixed gas flow condition, in contrast, produced a dramatic improvement in etch uniformity (see polysilicon etch results in FIG. 4b). Under the mixed flow conditions, the mean etch depth was 213.5±2.3 nm (±1.1%), with a range of only 7.7 nm (±0.6%). The polysilicon etch used a $Cl_2/HBr/O_2$ flow mixture at a total flow of 420 sccm and a chamber pressure of 10 mT. The RF antenna (top) power was 800 W, with a −155 V bias on the bottom electrode. The injector angle was 60°.

EXAMPLE 2

Figure 5C:
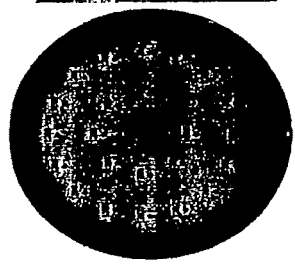
FIGS. 5 a-c show the effect of flow ratio on blanket silicon etch rate using an shallow trench isolation process.
Figure 5B:
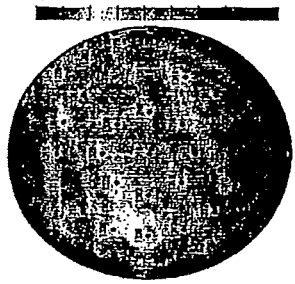
Figure 5A:

Silicon etch depth statistics (mean, standard deviation, and range) were measured as a function of on-axis:off-axis gas flow ratio. FIGS. 5a-c show etch rate profiles for a gate etch process wherein FIG. 5a shows the effect of higher on-axis gas injection and FIG. 5c shows the effect of higher off-axis injection. Predominately on-axis flow conditions produced an etch depth of 1299 Å±27 Å (±2.1%) and a range of 74 Å (±1.0%) (see polysilicon etch results in FIG. 5a). A mixed gas flow condition produced an etch depth of 1295 Å±23 Å (±1.8%) and a range of 76 Å (±1.0%) (see polysilicon etch results in FIG. 5b). Predominately off-axis flow conditions produced a dramatic improvement in etch uniformity (see polysilicon etch results in FIG. 5c). Under the off-axis flow conditions, the mean etch depth was 1272 Å±14 Å (±1.1%), with a range of 41 Å (±0.53%). The silicon etch used an $HBr/O_2$ flow mixture at a chamber pressure of 40 mT and a bottom electrode temperature of 60°. The RF antenna (top) power was 1200 W, with a −320 V bias on the bottom electrode. The injector angle was 45°.

EXAMPLE 3

FIGS. 6a-b show polysilicon gate critical dimension (CD) variation as a difference between pre- and post-etch for two different gas flow ratios. Increased on-axis flow is shown in FIG. 6a in comparison with increased off-axis flow shown in FIG. 6b. The use of tunable injection results in better CD uniformity. In particular, the results shown in FIG. 6a provided a mean CD variation of −3.9 nm, standard deviation of 2.1 nm and range of 7.5 nm whereas the results shown in FIG. 6b provided a CD variation of −3.4 nm, standard deviation of 1.6 nm and range of 5.9 nm.

EXAMPLE 4

FIGS. 7a-b show photoresist trim CD variation as a difference between pre- and post-etch for two different gas flow ratios. The use of tunable injection results in better CD uniformity. The process used a $Cl_2/O_2$ flow mixture with 100 sccm total flow at a chamber pressure of 5 mT and a bottom electrode temperature of 60°. The RF antenna (top) power was 385 W, with a −34 V self bias on the bottom electrode. The injector angle was 45°. In particular, the results shown in FIG. 7a provided a mean CD variation of −49.3 nm, standard deviation of 2.5 nm and range of 9.1 nm whereas the results shown in FIG. 7b provided a CD variation of −47.6 nm, standard deviation of 2.0 nm and range of 7.5 nm.

EXAMPLE 5

FIGS. 8a-b show polysilicon gate critical dimension (CD) variation as a difference between pre- and post-etch for two different gas flow ratios. FIG. 8a demonstrates that the mean CD variation can be adjusted solely by adjusting the gas flow ratios. A two step process using a $Cl_2/HBr/He/O_2$ mixture was used: in step 1 the chamber pressure was 15 mT with 400 sccm total flow, 575 W antenna (top/inductive) power, and −138 V self bias on bottom electrode; in step 2 the chamber pressure was 30 mT with 575 sccm total flow, 750 W antenna power, −80 V self bias on the bottom electrode. In particular, the results shown in FIG. 8a provided a mean CD variation of 0.1 nm, standard deviation of 2.4 nm and range of 9.5 nm whereas the results shown in FIG. 8b provided a CD variation of 13.3 nm, standard deviation of 2.4 nm and range of 8.9 nm.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A gas injector for supplying process gas into a semiconductor processing chamber comprising:
    an injector body which includes
        at least first and second gas inlets in an upper portion of an outer side surface of the injector body,
        at least first and second gas passages which receive a same gas, wherein the first gas passage is a central passage and the second gas passage is an annular passage surrounding the central passage, and
        at least first and second gas outlets,
    the first gas passage being in fluid communication with the first inlet and first outlet,
    the second gas passage being in fluid communication with the second inlet and second outlet,
    the first and second gas passages being discrete from each other so as to provide independently adjustable flow rates of the same gas through the first and second outlets,
    the first gas outlet comprising at least one on-axis gas outlet in an axial end of the injector body and
    the second gas outlet comprising a plurality of off-axis gas outlets in a lower portion of the side surface of the injector body which inject process gas in a plurality of directions.

2. The injector of claim 1, wherein the at least one first gas outlet is a single on-axis outlet extending in an axial direction in an axial end surface of the injector body and the plurality of off-axis outlets are spaced 45° apart and inject process gas at an angle of 45° with respect to the axial direction.

3. The injector of claim 1, wherein the injector body includes a planar axial end face and a conical side surface, the at least one first gas outlet comprising an on-axis outlet in the axial end face and the off-axis outlets being located in the conical side surface, the on-axis outlet connected to the central passage in the injector and the off-axis outlets connected to the annular passage surrounding the central passage.

4. The injector of claim 1, wherein the injector body is configured to support an electrically conducting shield which minimizes plasma ignition within the gas injector when the gas injector is mounted in an opening extending through a dielectric window comprising a top wall of an inductively coupled plasma chamber wherein a semiconductor substrate is undergoing plasma processing.

5. The injector of claim 1, wherein the injector body is entirely of quartz.

6. The injector of claim 5, wherein the injector body includes first and second radially extending gas passages wherein the first radially extending gas passage connects the first gas inlet to the central passage and the second radially extending gas passage connects the second gas inlet to the annular passage.

7. The injector of claim 5, wherein the off-axis gas outlets extend radially from an inner wall of the annular passage to the outer side surface of the injector body.

8. The injector of claim 1, wherein the injector body is cylindrical and is configured to be removably mounted in an opening of a dielectric window of an inductively coupled plasma etch reactor.

9. The injector of claim 1, wherein the injector body has a central bore forming the central passage, the at least one on-axis outlet is a single on-axis outlet having a diameter equal to a diameter of the central bore, and one end of the bore is configured to be sealed by a window through which interferometry measurements can be taken with optical monitoring equipment.

10. The injector of claim 1, wherein the injector body is adapted to be removably mounted in an opening of a window of a plasma chamber such that the on-axis and off-axis gas outlets are located below an inner surface of the window, a lower part of the injector body adapted to cooperate with an 0-ring which provides a vacuum seal between the injector body and the window.

11. The injector of claim 1, wherein the at least one first gas outlet is a single on-axis outlet extending in an axial direction in an axial end surface of the injector body and the plurality of off-axis outlets inject process gas at an angle of 10 to 60° with respect to the axial direction.

12. The injector of claim 1, wherein the central passage has a uniform diameter and the central passage extends through upper and lower axial ends of the injector body.

* * * * *

UNITED STATES PATENT AND TRADEMARK OFFICE
CERTIFICATE OF CORRECTION

PATENT NO. : 9,051,647 B2  
APPLICATION NO. : 12/605027  
DATED : June 9, 2015  
INVENTOR(S) : David J. Cooperberg et al.

Page 1 of 1

It is certified that error appears in the above-identified patent and that said Letters Patent is hereby corrected as shown below:

Title Page, Item (75) Inventor: "Valid Vahedi" should read --Vahid Vahedi--.

Signed and Sealed this  
Eighth Day of December, 2015

Michelle K. Lee  
*Director of the United States Patent and Trademark Office*